United States Patent
Hoke et al.

(10) Patent No.: US 8,212,294 B2
(45) Date of Patent: Jul. 3, 2012

(54) STRUCTURE HAVING SILICON CMOS TRANSISTORS WITH COLUMN III-V TRANSISTORS ON A COMMON SUBSTRATE

(75) Inventors: William E. Hoke, Wayland, MA (US); Jeffrey R. LaRoche, Lowell, MA (US)

(73) Assignee: Raytheon Company, Waltham, MA (US)

( * ) Notice: Subject to any disclaimer, the term of this patent is extended or adjusted under 35 U.S.C. 154(b) by 247 days.

(21) Appl. No.: 12/695,518

(22) Filed: Jan. 28, 2010

(65) Prior Publication Data

US 2011/0180857 A1    Jul. 28, 2011

(51) Int. Cl.
    *H01L 27/085*   (2006.01)
(52) U.S. Cl. .. 257/255; 257/369; 257/627; 257/E27.062
(58) Field of Classification Search .............. 257/255, 257/627, 369, E27.062
    See application file for complete search history.

(56) References Cited

U.S. PATENT DOCUMENTS

| | | | |
|---|---|---|---|
| 3,979,612 | A | 9/1976 | Mudge et al. |
| 5,373,171 | A | 12/1994 | Imai et al. |
| 5,766,783 | A | 6/1998 | Utsumi et al. |
| 5,903,015 | A | 5/1999 | Shiomi et al. |
| 7,368,334 | B2 * | 5/2008 | Yeo et al. ............ 438/150 |
| 2002/0031851 | A1 | 3/2002 | Linthicum et al. |
| 2003/0020068 | A1 | 1/2003 | Finder |
| 2005/0139838 | A1 | 6/2005 | Murata et al. |
| 2006/0054926 | A1 | 3/2006 | Lahreche |
| 2006/0231899 | A1 | 10/2006 | Chang et al. |

OTHER PUBLICATIONS

Bin (Frank) Yang et al., CMOS fabricated by Hybrid-Orientation Technology (HOT), 2007, IEEE, pp. 8-13.
K. Dovidenko, et al., Aluminum Nitride Films on Different Orientations of Sapphire and Silicon, Nov. 6, 1995 1996 American Institute of Physics. pp. 2439-2445.
Joff Derluyn, et al., Power Performance of AlGaN/GaN HEMT's Grown on 6Δ Si Substrates, 2008, vol. 1068, pp. 1-6.
Haifeng Sun, et al., 102-GHz AllnN/GaN HEMTs on Silicon With 2.5-W/mm Output Power at 10 GHz, 2009, IEEE, pp. 1-3.
Notification of Transmittal of the International Search Report and the Written Opinion of the International Searching Authority, or the Declaration, PCT/US2007/022325, date of mailing Apr. 10, 2008, 5 pages.
The Written Opinion of the International Searching Authority, PCT/US2007/022325, date of mailing Apr. 10, 2008, 7 pages.

(Continued)

*Primary Examiner* — Tan N Tran
(74) *Attorney, Agent, or Firm* — Daly, Crowley, Mofford & Durkee, LLP

(57) ABSTRACT

A semiconductor structure having: a silicon substrate having a crystallographic orientation; an insulating layer disposed over the silicon substrate; a silicon layer having a different crystallographic orientation than the crystallographic orientation of the substrate disposed over the insulating layer; and a column III-V transistor device having the same crystallographic orientation as the substrate disposed on the silicon substrate. In one embodiment, the column III-V transistor device is in contact with the substrate. In one embodiment, the device is a GaN device. In one embodiment, the crystallographic orientation of the substrate is <111> and wherein the crystallographic orientation of the silicon layer is <100>. In one embodiment, CMOS transistors are disposed in the silicon layer. In one embodiment, the column III-V transistor device is a column III-N device. In one embodiment, a column III-As, III-P, or III-Sb device is disposed on the top of the <100> silicon layer.

8 Claims, 3 Drawing Sheets

OTHER PUBLICATIONS

Miskys et al., "AlN/diamond heterojunction diodes", Applied Physics Letters, AIP, 2003 American Institute of Physics, Melville, NY, US, vol. 82, No. 2, Jan. 13, 2003, pp. 290-292, XP012034092, ISSN: 0003-6951.

Polyakov et al., "Growth of AlBN Solid Solutions by Organometallic Vapor-Phase Epitaxy" Journal of Applied Physics, American Institute of Physics, vol. 81, No. 4, Feb. 15, 1997, pp. 1715-1719, XP012041570, ISSN: 0021-8979.

Vescan et al., "High-Temperature High-Voltage Operation of Pulse-Doped Diamond MESFET", IEEE Electron Device Letters, vol. 18, No. 5, May 1997, pp. 222-224, XP011018247, ISSN: 0741-3106.

Edgar et al., "c-Boron-Aluminum Nitride Alloys Prepared by Ion-Beam Assisted Deposition", Thin Solid Films, Elsevier-Sequoia S.A. Lausanne, Ch, vol. 298, No. 1-2, Apr. 20, 1997, pp. 33-38, XP004125912, ISSN: 0040-6090.

U.S. Appl. No. 12/497,994, filed Jul. 6, 2009, 17 pages.

USPTO Office Action dated Jul. 19, 2010 for U.S. Appl. No. 12/497,994, 9 pages.

Response to the Office Action dated Jul. 19, 2010 for U.S. Appl. No. 12/497,994, 4 pages.

USPTO Office Action dated Dec. 29, 2010 for U.S. Appl. No. 12/497,994, 7 pages.

File downloaded for U.S. Appl. No. 12/497,994, filed Jul. 6, 2009, file through Jan. 14, 2011, 136 pages.

Notification of Transmittal of the International Search Report and the Written Opinion of the International Searching Authority, or the Declaration, PCT/US2011/022358, date of mailing Mar. 22, 2011, 6 pages.

Written Opinion of the International Searching Authority, PCT/US2011/022358, date of mailing Mar. 22, 2011, 7 pages.

Chung et al.,: "Seamless On-Wafer Integration of Si(100) MOSFETs and GaN HEMTs" IEEE Electron Device Letters, IEEE Service Center, New York, NY, US, vol. 30, No. 10, Oct. 1, 2009, pp. 1015-1017, XP011275791, ISSN: 0741-3106, DOI: 10.1109/LED.2009.2027914.

Kazior et al.,: "A high performance differential amplifier through the direct monolithic integration of InP HBTs and Si CMOS on silicon substrates", Microwave Symposium Digest, 2009. MTT '09. IEEE MTT-S International, IEEE, Piscataway, NJ. USA, Jun. 7, 2009, pp. 1113-1116, XP031490718, ISBN: 978-1-4244-2803-8.

Haffouz et al.,: "Selectively grown AlGaN/GaN HEMT on Si(111) substrates for integration with silicon microelectronics", Journal of Crystal Growth, Elsevier, Amsterdam, NL vol. 311, No. 7, Mar. 15, 2009, pp. 2087-2090, XP026065810, ISSN: 0022-0248, DOI: 10.1016/J.JCRYSGRO.2008.10.105.

* cited by examiner

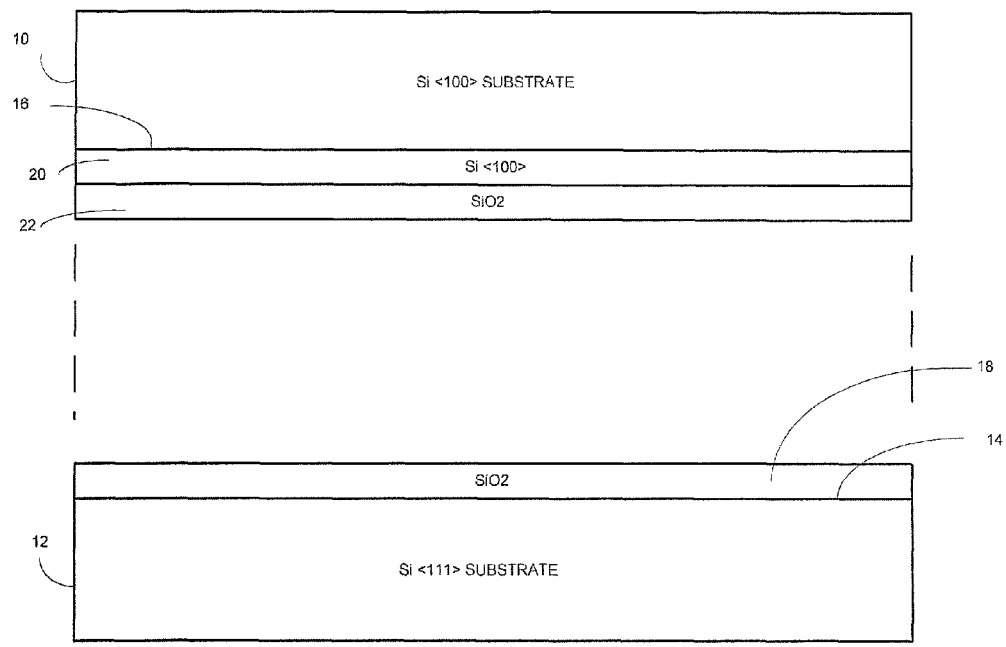
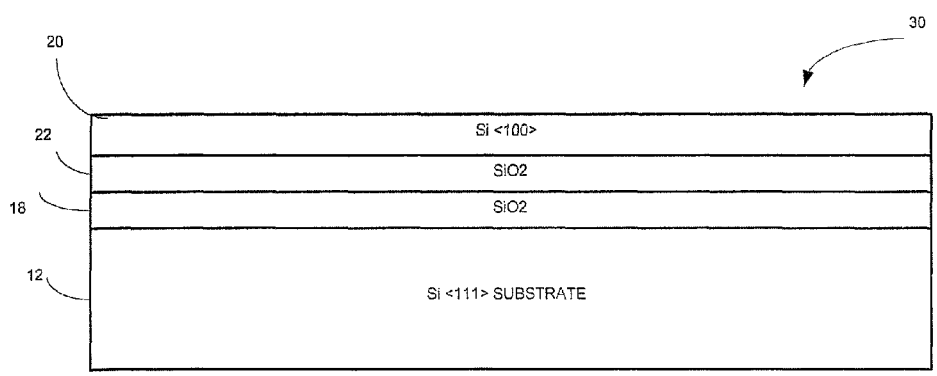
FIG. 4

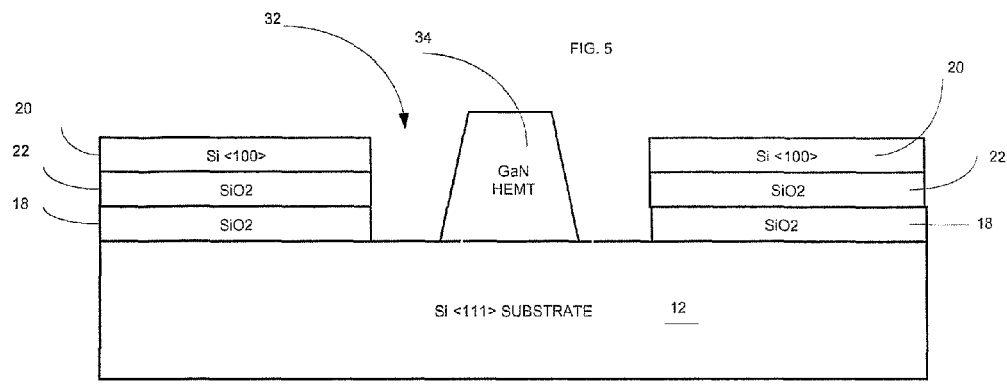
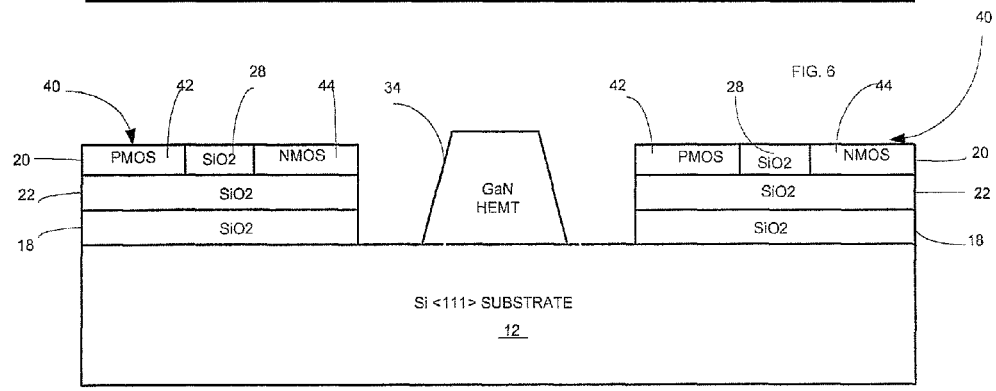
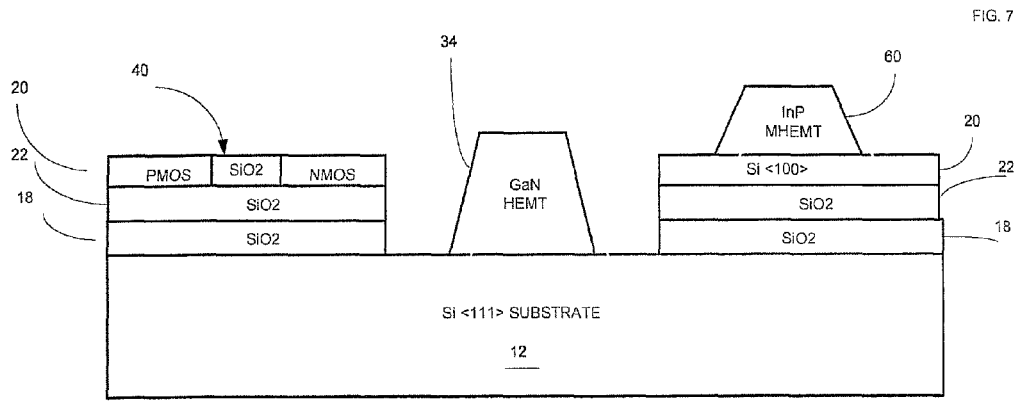

STRUCTURE HAVING SILICON CMOS TRANSISTORS WITH COLUMN III-V TRANSISTORS ON A COMMON SUBSTRATE

TECHNICAL FIELD

This disclosure relates generally to semiconductor structures and more particularly to semiconductor structures having silicon CMOS transistors with column III-V transistors on a common substrate.

BACKGROUND AND SUMMARY

As is known in the art, many electronics applications incorporate both silicon and column III-V circuits due to their unique performance characteristics. The silicon circuits are typically CMOS circuits used for digital signals and the column III-V circuits are for microwave, millimeterwave, and optical signals. Typically this integration is done by fabricating the silicon and column III-V circuits separately on different chips and then electrically connecting them, often with wire bonds. This process is expensive, limits integration complexity, increases the footprint, and introduces parasitic resistances and inductances which degrade circuit performance.

It is also known in the art that transistors have been formed on silicon having <100> and <111> crystallographic orientations (i.e., where, as is well known, a <100> crystallographic orientation is where the <100> axis of the crystalline silicon is normal (i.e., perpendicular) to the layer growing or depositing surface of the silicon and a <111> crystallographic orientation is where the <111> axis of the crystalline silicon is normal (i.e., perpendicular) to the layer growing or depositing surface of the silicon). Many years ago, CMOS was formed on silicon substrates having <111> crystallographic orientations; however this orientation is inferior for CMOS than the <100> crystallographic orientation due to a higher surface state density on <111> crystallographic orientation.

One CMOS structure is called a silicon-on-insulator (SOI) structure. This SOI structure includes a silicon substrate having a <100> crystallographic orientation. An insulating layer of SiO2 is formed on the silicon substrate. An upper device layer of silicon having a <100> crystallographic orientation is formed on the insulating layer; the insulating layer being used to assist electrical isolation of the CMOS transistor devices formed in the upper silicon layer. Thus, both the upper device layer and the substrate have the same crystallographic orientation (i.e., a <100> crystallographic orientation).

It is also known that it is desirable to have silicon CMOS transistors and column III-V (e.g. GaN, GaAs or InP) transistors on a common substrate. One structure used to form CMOS transistors and column III-V transistors on a common substrate is shown in FIG. 1. There, a GaAs transistor is formed on the same substrate as the CMOS transistors. It is also known that GaAs grown on a growth layer having a <100> crystallographic orientation provides a layer with a minimum number of crystalline defects. To provide this <100> growth layer for the GaAs device, a Ge layer having a <100> crystallographic orientation is used, as shown in FIG. 1 of the disclosure. However, Ge melts at 938 degrees C. and thereby limits the fabrication temperatures used in fabricating the CMOS devices. Also, Ge causes cross doping of the GaAs device resulting in increased microwave power loss. Additionally the starting wafer in FIG. 1 requires two layer transfers which is an expensive process.

It is also known in the art that a column III-V (such as a column III-N, for example, GaN, AlN, GaAlN, InGaN) device can be formed on a silicon substrate. Since it is preferable that the GaN device be formed with <111> crystallographic orientation to minimize crystal defects, the device is typically formed on a substrate (e.g., silicon) having a <111> crystallographic orientation. This device is shown in the middle portion of the structure shown in FIG. 2.

The inventors have recognized that there is an advantage in modifying the SOI structure described above by using a silicon substrate having a <111> crystallographic orientation rather than a <100> crystallographic orientation so that the column III-N device can be formed on the same <111> crystallographic orientation substrate as the CMOS devices with such substrate being crystallographically matched to the preferred <111> crystallographic orientation for the column III-N device. An additional advantage recognized by the inventors is having both the <111> silicon orientation and the <100> silicon orientation present in the starting wafer so that column III-As, column III-P and column III-Sb devices, which grow with fewest defects on the <100> orientation, can also be combined on the same substrate with column III-N devices and CMOS.

In one embodiment, a semiconductor structure is provided having: a silicon substrate having a crystallographic orientation; an insulating layer disposed over the silicon substrate; a silicon layer having a different crystallographic orientation than the crystallographic orientation of the substrate disposed over the insulating layer; and a column III-V transistor device having the same crystallographic orientation as the substrate disposed on the silicon substrate.

In one embodiment, the column III-V transistor device is in contact with the substrate.

In one embodiment, the device is a column III-V device is a III-N device.

In one embodiment, the III-V device is a GaN, AlN, AlGaN or InGaN device.

In one embodiment, the crystallographic orientation of the substrate is <111> crystallographic orientation and wherein the crystallographic orientation of the silicon layer is <100> crystallographic orientation.

In one embodiment, CMOS transistors are disposed in the silicon layer.

In one embodiment, a semiconductor structure is provided having: a silicon substrate having a crystallographic orientation; an insulating layer disposed over the substrate; a silicon layer having a different crystallographic orientation than the crystallographic orientation of the substrate disposed over the insulating layer; and wherein the crystallographic orientation of the substrate is <111> and the crystallographic orientation of the silicon layer is <100>.

With such a structure:
1. The silicon substrate has the proper crystallographic orientation for GaN growth or other column III-N materials. For GaN power amplifiers it is attractive to minimize thermal resistance by having the GaN HEMT directly on the silicon surface with no intervening layers or wafer bonding interfaces. Furthermore selective etches (silicon and GaN are chemically dissimilar materials) can be used to fabricate thermal vias through the silicon substrate to the GaN HEMT.
2. There is no germanium in this structure so that normal CMOS thermal processing conditions can be used.
3. Germanium cross doping is eliminated.
4. The SOI wafers used in the embodiments described are relatively inexpensive due to high volume silicon production and that the SOI structure requires only one wafer bond compared with the structure shown in FIG. 1 which requires two wafer bonds.

5. Another benefit of the SOI wafer used in the embodiments described is that the top silicon layer has the proper crystallographic orientation for fabricating CMOS and metamorphic column III-V devices such as metamorphic column III-As, III-P, and III-Sb devices, therefore other metamorphic column III-V structures could be grown as well such as a metamorphic InP HBT, metamorphic HEMT (MHEMT) or metamorphic optical devices.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 3 through 6 show a semiconductor structure at various steps in the fabrication thereof in accordance with an embodiment of the disclosure; and FIG. 7 is a semiconductor structure at various steps in the fabrication thereof in accordance with another embodiment of the disclosure.

Like reference symbols in the various drawings indicate like elements.

DETAILED DESCRIPTION

Figure 1:
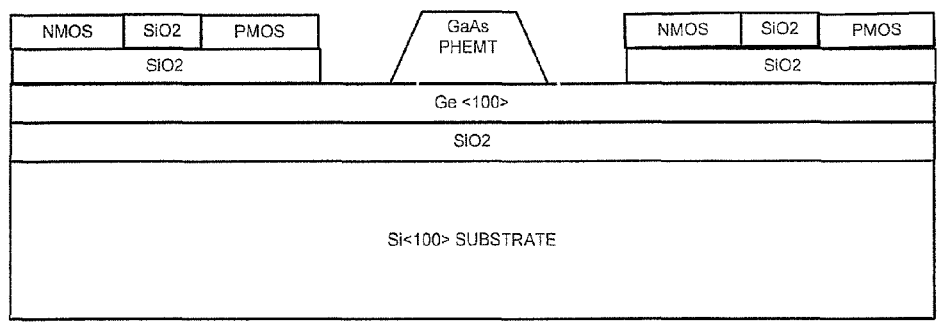
FIG. 1 is a semiconductor structure according to the PRIOR ART.
Figure 2:
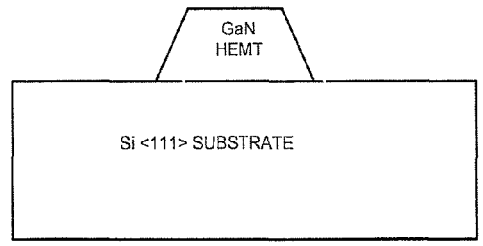
FIG. 2 is a semiconductor structure according to the PRIOR ART.

Referring now to FIG. 3, a pair of silicon wafers 10, 12 or substrates are shown in an exploded view. One of the substrates 12 has a <111> crystallographic orientation (i.e., the <111> crystallographic axis is normal to the upper surface 14 of the substrate) and the other one of the substrates 10 has a <100> crystallographic orientation (i.e., the <100> crystallographic axis is normal to the 16 surface of the substrate). The substrate 12 has a layer 18 of silicon dioxide formed thereof by any conventional technique.

The other substrate 10 has a silicon layer 20, in the order of several microns, of silicon with a <100> crystallographic orientation formed on surface 16 of the substrate 10 thereof by any convention techniques such as for example epitaxial growth. The active layer 20 is doped in any conventional manner for the desired CMOS application. A layer 22 of silicon dioxide is formed by conventional deposition or growth on the silicon layer 20. The surfaces of silicon dioxide layers 18, 22 are brought into contact, heated to bond, and then the top silicon wafer is polished away as well as part of the silicon layer, thus leaving the desired silicon layer 20 thickness leaving the structure 30 as shown in FIG. 4. Alternatively, the silicon dioxide layer 22 and the silicon layer 20 are implanted with hydrogen to a desired depth into the silicon layer 20, then the two silicon dioxide layers 18, 22 surfaces are brought together, heated up to bond, heated up hotter to allow the hydrogen to expand and split off the top silicon substrate 10 with part of the silicon layer 20. Light polishing is then done to smooth the surface of the silicon layer 20 (which is rough after the splitting) and to obtain the desired final thickness of the silicon layer 20 leaving the structure 30 as shown in FIG. 4; or alternatively, the SiO2 surfaces are bonded together and then polish down the top silicon substrate and into the silicon layer. Hydrogen is the implanted through the silicon dioxide layer 22 to a depth close to the desired thickness for the CMOS devices to be formed in the silicon layer 20, typically in the order of one micron into the surface of the silicon layer 20. Then the two silicon dioxide layer 18, 22 surfaces are brought together, heated up to bond, and then heated hotter for the implanted hydrogen to expand and split off the substrate 10 leaving the structure 30 shown in FIG. 4.

Next, a mask, not shown, is formed over a portion of the structure so that a window 32 is etched through the silicon layer 20 and the silicon dioxide layers 22, 18 as shown in FIG. 5.

Next, a column III-N device, here for example, a GaN HEMT 34 is formed through the window in contact with the substrate 12, as shown in FIG. 5 while the silicon layers 20 remain masked. It is noted that the GaN grows vertically along the <111> crystallographic axis of the substrate 12. It is also to be noted that a coating such as SiO2, not shown, is deposited on the silicon layer to protect it while the GaN HEMT is being grown since GaN will grow over the entire wafer.

Next, with the GaN HEMT 34 masked by a mask not shown, and with the mask over the silicon layer removed, CMOS transistors 40 are formed in the silicon layer 20 with PMOS 42 and NMOS transistors 44 being electrically isolated with silicon dioxide 28, as indicated in FIG. 6.

As noted above, since the silicon layer 20 is the top silicon layer and has the proper <100> crystallographic orientation for fabricating CMOS it also has proper crystallographic orientations for forming metamorphic column III-V devices, such as metamorphic column III-As, III-P, and III-Sb devices. Therefore other metamorphic column III-V (e.g., metamorphic column III-As, III-P, and III-Sb) structures could be grown as well such as a metamorphic InP HEMT or metamorphic optical devices. For example, referring to FIG. 7, here CMOS transistors 40 are formed on one portion of the silicon, layer 20 and an MHEMT device 60 here a column III-As, column III-P, or column III-Sb device, here a InP device, is formed on another portion of the silicon layer 20. It is noted that the InP MHEMT is in contact with, and is grown along, the <100> crystallographic axis of the silicon layer 20.

The process described above is to form the GaN HEMT first and then form the CMOS. It is to be noted that the CMOS devices may be formed first since it is a higher temperature process. Then the top silicon layer, which has the CMOS devices, is coated with SiO2 to protect the CMOS devices from subsequent GaN growth. Then windows are formed down to the silicon substrate by etching through the top SiO2 layer, layers 20, 22, and 18. Next, the GaN HEMT is grown.

A number of embodiments of the disclosure have been described. Nevertheless, it will be understood that various modifications may be made without departing from the spirit and scope of the disclosure. For example, other technique may be used to process structure 30 in FIG. 4. Further, other column III-N devices may be formed, such as for example, AlN, AlGaN, InGaN. Accordingly, other embodiments are within the scope of the following claims.

What is claimed is:

1. A semiconductor structure comprising:
   a silicon substrate having a <111> crystallographic orientation;
   an insulating layer disposed over a first portion of the silicon substrate;
   a silicon layer disposed over the insulating layer;
   wherein the silicon layer has a <100> orientation which is a different crystallographic orientation than the crystallographic orientation of the substrate; and a column III-V device having the same crystallographic orientation as the substrate disposed on a second portion of the silicon substrate.

2. The structure recited in claim 1 wherein the column III-V device is in contact with the substrate.

3. The structure recited in claim 2 wherein the column III-V device is a column III-N device.

4. The structure recited in claim 3 including CMOS transistors disposed in the silicon layer.

5. The structure recited in claim 2 including CMOS transistors disposed in the silicon layer.

6. The semiconductor structure recited in claim 2 including a column III-As, column III-P, or column III-Sb device on the silicon layer.

7. The semiconductor structure recited in claim 3 including a column III-As, column III-P, or column III-Sb device on the silicon layer.

8. The semiconductor structure recited in claim 1 including a column III-As, column III-P, or column III-Sb device on the silicon layer.

* * * * *